United States Patent
Shurboff

[19]

[11] Patent Number: 6,035,182

[45] Date of Patent: Mar. 7, 2000

[54] SINGLE COUNTER DUAL MODULUS FREQUENCY DIVISION APPARATUS

[75] Inventor: Carl Lynn Shurboff, Grayslake, Ill.

[73] Assignee: Motorola, Inc., Schaumburg, Ill.

[21] Appl. No.: 09/009,477

[22] Filed: Jan. 20, 1998

[51] Int. Cl.[7] ................................................. H04H 5/00

[52] U.S. Cl. ......................... 455/216; 455/205; 455/112; 327/117; 370/281; 370/295; 370/478

[58] Field of Search ............................ 455/180.3, 181.1, 455/182.1, 184.1, 205, 216, 112; 375/222; 331/16, 2, 1 R; 327/105, 115, 117; 340/820.12; 370/295, 281, 478; 329/344

[56] References Cited

U.S. PATENT DOCUMENTS

| | | | |
|---|---|---|---|
| 4,024,476 | 5/1977 | Briggs | 455/180.3 |
| 4,053,739 | 10/1977 | Miller et al. | 708/103 |
| 4,891,825 | 1/1990 | Hansen | 377/52 |
| 5,065,408 | 11/1991 | Gillig | 375/222 |
| 5,066,927 | 11/1991 | Dent | 331/1 A |
| 5,150,082 | 9/1992 | Grimmett et al. | 332/128 |
| 5,180,993 | 1/1993 | Dent | 331/16 |
| 5,351,015 | 9/1994 | Masumoto et al. | 331/1 R |
| 5,610,559 | 3/1997 | Dent | 331/2 |
| 5,825,213 | 10/1998 | Barrett, Jr. et al. | 327/105 |

*Primary Examiner*—Wellington Chin
*Assistant Examiner*—Isaak R. Jama
*Attorney, Agent, or Firm*—Paul J. Bartusiak

[57] ABSTRACT

A single counter dual modulus frequency divider apparatus (400) utilizes a programmable divider (508) configured to receive an RF input signal at the divider system input (500) and a modulus control (516) produced by a programmable counter (510). The modulus control (516) sets a divide value of the programmable divider (508) to produce a divided signal at a programmable divider output (514). A switch (512) is configured to receive a first program instruction at the first program instruction input (504) and a second program instruction at a second program instruction input (506) to produce a count control (518). The programmable counter (510) receives the divided signal appearing at the programmable divider output (514) and the count control (518). The count control (518) sets the count value of the programmable counter (510). The programmable counter (510) counts periods of the divided signal appearing at the programmable divider output (514) to produce the output divided signal at the divider system output (502).

8 Claims, 3 Drawing Sheets

— PRIOR ART —

— PRIOR ART —

6,035,182

SINGLE COUNTER DUAL MODULUS FREQUENCY DIVISION APPARATUS

FIELD OF THE INVENTION

This invention relates generally to dual modulus frequency divider systems, and more particularly to a method and apparatus for dual modulus frequency division using a single programmable counter.

BACKGROUND OF THE INVENTION

Phase-locked loop (PLL) frequency synthesis is a well known technique for generating one of many related signals from a voltage controlled oscillator (VCO). In a single loop PLL, an output signal from a VCO is coupled to a programmable frequency divider which divides by a selected number to provide a frequency divided signal. The frequency divided signal is applied to a phase detector which compares the frequency divided signal to a reference signal from another fixed frequency oscillator. The reference signal is often selected for stability of frequency over time and environmental changes. Any difference in phase between the frequency divided signal and the reference signal results in an output from the phase detector that is converted to a charge by the charge pump and coupled through a loop filter to create a correction signal. The correction signal is then applied to the VCO in a manner which causes the output signal from the VCO to change in frequency such that the phase error between the frequency divided signal and the reference signal is minimized.

At radio frequencies (RF), frequency division becomes more difficult, and the result is that higher frequency performance is achieved at the expense of higher power consumption. In applications such as portable communication systems, higher power consumption decreases the talk time and the standby time available before subsequent battery recharging is necessary.

A way to lower the frequency performance requirement of the frequency divider is to distribute the frequency division process. A distributed frequency divider system would have a first frequency divider working at the RF frequency and a second frequency divider operating at the lower, divided frequency. For example, if the total frequency division required, $N_T$ is 189, the frequency division could be accomplished by dividing the RF signal first by a factor of 7, and then dividing the resultant signal by a factor of 27. The total frequency division of the output divided signal is then:

$$N_T=\text{(first division factor)}*\text{(second division factor)}=(7)*(27)=189$$

By distributing the frequency division, only the first division process has to operate at the RF input frequency. A power savings would result by the relaxed frequency performance requirement of the second frequency divider.

The RF signal generated by the synthesizer is related to the overall divide number, $N_T$ of the divider system. In order to change the frequency of the RF signal that is generated, the synthesizer must be programmable. This programmability is obtained in part by making the first and second dividers of the divider system programmable.

The basic structure of a conventional dual modulus frequency divider system suitable for use in a radiotelephone is shown in the block diagram of FIG. 1. A conventional dual modulus frequency divider system 150 utilizes a programmable divider 108 with a divider system input 100. The divided signal appearing at the programmable divider output 114 is directed to a first counter 110 and a second counter 112. The first counter 110 has a first program instruction input 106 to set the first counter 110 to a first counter value of "A". The second counter 112 has a second program instruction input 104 to set the second counter 112 to a second counter value of "N". The first counter 110 provides a divide (modulus) control 116 to the programmable divider 108 in order to set the divide value of the programmable divider 108. The second counter 112 is configured to have a divider system output 102. The first, high frequency division function of the overall distributed frequency division process is accomplished with the programmable divider 108. The second, lower frequency division function of the overall distributed frequency division process is accomplished by utilizing the first counter 110 and the second counter 112.

The programmable divider 108 is configured to have two programmable frequency division values (dual modulus). The first divide value is P+1, and the second divide value is P, where P is a predetermined value. The first counter 110 receives a first program instruction at the first program instruction input 106, and the second counter 112 receives a second program instruction at the second program instruction input 104. With the programming of the programmable divider variable, P, along with the programming of the first counter 110 and the second counter 112, the programming of the overall required divide ratio, $N_T$, is accomplished.

The modulus control 116 sets the programmable divider 108 to the first divide value, P+1. The programmable divider 108 then divides the RF input signal appearing at the divider system input 100 by the first divide value, P+1. The first counter 110 counts the periods of the divided signal appearing at the programmable divider output 114. When the first counter 110 has counted A periods of the divided signal appearing at the programmable divider output 114, the first counter 110 uses the modulus control 116 to set the first divider 108 to its second divide value, P. The programmable divider 108 then divides the RF input signal appearing at the divider system input 100 by the second divide value, P, and the second counter 112 counts the periods of the divided signal appearing at the programmable divider output 114. When the second counter 112 has counted N−A additional periods of the divided signal appearing at the programmable divider output 114, the overall divide value, $N_T$, has been achieved. The final output divided signal is produced at the divider system output 102. The total divide ratio, $N_T$, is then defined by:

$$N_T=PN+A$$

The second counter 112 is the master counter. When the second counter 112 fully decrements to a terminal value, such as 000, everything in the conventional dual modulus frequency divider system 150 is re-programmed. A single period of the output divided signal appearing at the divider system output 102 represents a single programming cycle. Beyond the initial programming of the first counter 110 to a count value of A and the second counter to a count value of N, no further programming is performed during a single programming cycle.

FIG. 2 is an example of the waveforms which would result when the overall divide ratio, $N_T$, is set to 17, the first counter 110 is set to a count value of A=3, the second counter 112 is set to a count value of N=7, and P=2. At time 212, the first counter 110 and the second counter 112 are programmed to their A and N values, respectively. Also at time 212, the first counter 110 directs the modulus control signal 208 to the programmable divider 108. The programmable divider 108 then divides the RF input signal 200 by a factor of P+1=3, and the first counter 110 counts A=3 periods of the divided signal 202. The first counter signal 204 represents the decrementing value of the first counter 110. The second counter 112 also begins to decrement its value, although as long as the first counter 110 is still decrementing its value, the second counter 112 does not contribute to the division process. The second counter signal 206 represents the decrementing value of the second counter 112. After the first counter 110 has fully decremented at time 214, the modulus control signal 208 sets the programmable divider 108 to a divide value of P=2. The second counter 112 then counts N−A=4 additional periods of the divided signal 202 and produces the output divided signal 210 at the divider system output 102. When the second counter 112 has fully decremented at time 216, everything in the divider system is re-programmed.

A single period of the output divided signal 210 represents a single programming cycle. Beyond the initial programming of the first counter 110 to a count value of A and the second counter 112 to a count value of N, no further programming is performed during a single programming cycle.

There are several drawbacks associated with the conventional dual modulus frequency divider system. The first drawback is that the first counter 110 and the second counter 112 are always active, resulting in unnecessary power consumption. For example, when the first counter 110 is counting periods of the divided signal 202, the second counter 112 is still active and decrementing its value. The second drawback is that the final output divided signal 210 at the divider system output 102 has a duty cycle of much less that 50%. The resultant output divided signal 210 thus increases the bandwidth requirement of the circuitry that must further process the output divided signal 210. The third drawback is that the need for two separate counters increases the size and power consumption of the overall divider system. In portable communication systems, it is desirable to minimize size for ease of use and handling and to reduce manufacturing costs. The fourth drawback is that the A count value of the first counter 110 must always be less than the N count value of the second counter 112. If A was greater than N, then the second counter 112 would fully decrement and the system would be reset before the first counter 110 has finished decrementing.

In one known reference of a previous application, the prior art discloses a dual modulus programmable frequency divider that utilizes a pre-loadable binary ripple counter. The device pre-loads a count value, N1, into a pre-loadable binary counter but also pre-loads a compare value, N2, into a comparator. A prescaler divides the input signal by a first divide value, and the pre-loadable counter begins to count periods of the first divided signal produced by the prescaler. When the comparator detects the compare value, the prescaler is set to a second divide value, and the pre-loadable counter counts a remaining number of periods of the second divided signal.

Since the pre-loadable counter and the comparator are only loaded once during a complete frequency division period, this results in the limitation that N1 must be less than N2. This limitation can result in a final divided signal duty cycle that is not close to 50%. The limitation also can result in an increase in the number of flip-flops that are needed to make up the pre-loadable counter. Another drawback is that by using the arrangement of a pre-loadable counter and a comparator, the frequency performance of the device is limited because of the fact that the low current ripple counter places the constraint that all of the bits in the device must settle before the comparison function occurs. Also, the comparator utilizes combinatorial logic which further limits the frequency performance of the device. The comparator and the extra logic circuitry needed to link the comparator to the device also increases the overall size of the device.

In another known reference of a previous application, the prior art discloses a dual modulus programmable frequency divider that utilizes a single programmable counter which sequentially loads first an A count value and then a B count value. The device loads the A count value and the modulus control sets the prescaler to the first divide value. Once the counter reaches its final value, the modulus control sets the prescaler to the second divide value and the device loads the B count value. In this prior art approach, the modulus control signal is also the final output divided signal.

There are two significant drawbacks to this approach. First, since the output divided signal is also the modulus control signal, the A or B values cannot be programmed to equal zero. The capability to program either the A or B count value to equal zero is highly desirable for many applications for which the device would be used, and thus the inability to program the A or B count value to equal zero severely limits the system. Second, the critical path in terms of time delay in the device is from the prescaler output, to the binary counter output, to the selection flip-flop output, and finally through the selection of the A or B count value and the loading of the selected value into the binary counter. This time delay reduces the maximum speed and increases the power dissipation of the device. Circumventing the critical path in terms of time delay would therefore increase the speed of a single counter dual modulus system and also significantly reduce the power consumption.

Accordingly, there is a need for a dual modulus programmable frequency divider system that utilizes only one counter that is programmed twice during a single period of a final output divided signal. The single counter dual modulus frequency divider system must have the capability for the A and B count value to be programmed to zero. There is also a need to circumvent the critical timing path in single counter dual modulus frequency divider systems to both increase frequency performance and reduce power dissipation. In addition, there is a further need that the dual modulus programmable frequency divider system not contain a comparator circuit and the associated additional logic circuitry needed for the comparator interface. The result would be a power consumption and area savings, an increase in frequency performance, a removal of the constraint that A must be less than N, and a removal of the constraint that A and N must be greater than zero. An output divided signal that has a duty cycle close to 50% would also result.

DETAILED DESCRIPTION OF A PREFERRED EMBODIMENT

A single counter dual modulus frequency divider apparatus accepts an input signal and program instructions. The program instructions set a single programmable counter to a first count value and a second count value. The programmable counter applies a modulus control to a programmable divider to set a first divide value. The input signal is divided by the programmable divider, and the programmable counter counts first count value periods of the divided signal. The programmable counter then applies the modulus control to the programmable divider to set a second divide value. The input signal is divided by the programmable divider, and the programmable counter counts second count value periods of the divided signal. A total divide ratio is achieved, and a final output divided signal is produced from the programmable counter.

Figure 1:
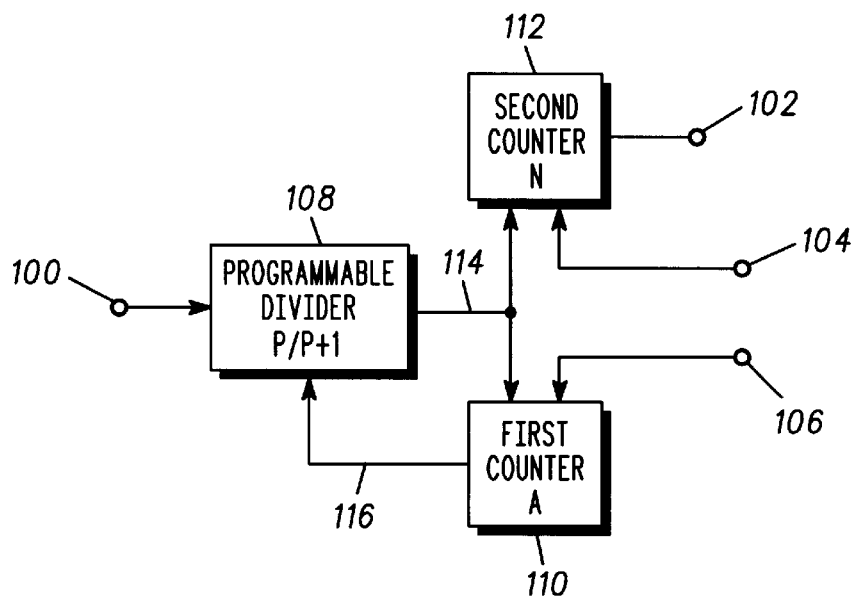
FIG. 1 is a block diagram of a prior art dual modulus frequency divider system employing two separate counters.
Figure 2:
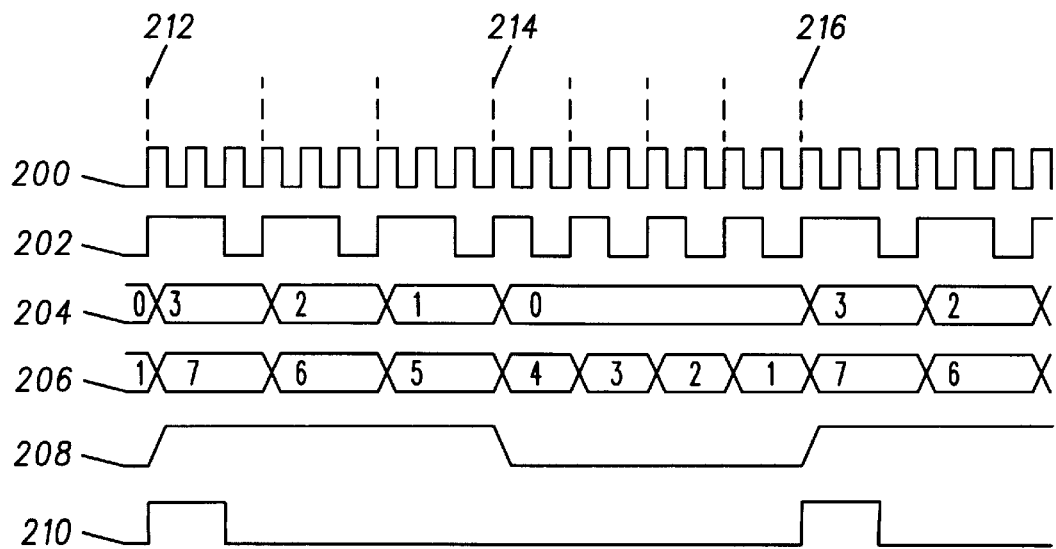
FIG. 2 illustrates possible clock waveforms for the prior art dual modulus frequency divider system of FIG. 1 employing two separate counters.
Figure 3:
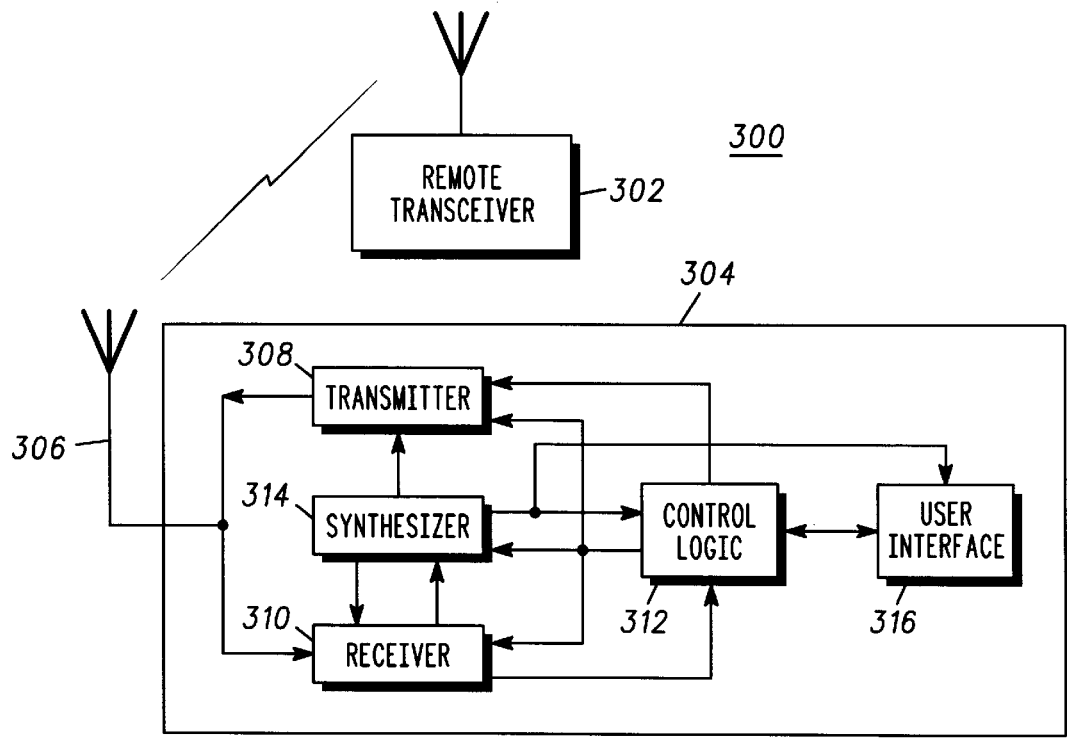
FIG. 3 is a block diagram of a radiotelephone which may employ a single counter dual modulus frequency divider apparatus.

The preferred embodiment of the present invention encompasses a single counter dual modulus frequency divider apparatus implemented in the synthesizer of a radiotelephone. FIG. 3 is an illustration in block diagram form of a radiotelephone communication system 300. The radiotelephone communication system 300 includes a remote transceiver 302 and one or more radiotelephones such as radiotelephone 304. The remote transceiver 302 sends and receives RF signals to and from radiotelephones within a fixed geographic area.

The radiotelephone 304 is one such radiotelephone contained within the geographic area and includes an antenna 306, a transmitter 308, a receiver 310, control logic 312, a synthesizer 314, and a user interface 316. The radiotelephone 304 detects RF signals containing data through the antenna 306 and produces detected RF signals. The receiver 310, coupled to the antenna 306, converts the detected RF signals into electrical baseband signals, demodulates the electrical baseband signals, recovers the data, including automatic frequency control information, and outputs the data to the control logic 312. The control logic 312 formats the data into recognizable voice or data information for use by user interface 316. The user interface 316 communicates the received information or voice to a user. Typically, the user interface 316 includes a microphone, a speaker, a display, and a keypad.

To transmit RF signals containing information from the radiotelephone 304 to the remote transceiver 302, the user interface 316 directs user input data to the control logic 312. The control logic 312 typically includes a microprocessor, memory, a clock generator, and a power amplifier control circuit. The control logic 312 formats the information obtained from the user interface 316 and conveys it to the transmitter 308 for conversion into RF modulated signals. The transmitter 308 conveys the RF modulated signals to the antenna 306 for transmission to the remote transceiver 302.

The synthesizer 314 provides the receiver 310 and the transmitter 308 with signals, tuned to the proper frequency, to allow the reception and transmission of data and information. Control over functions of the transceiver, such as channel of operation frequency, is provided by the control logic 312, and is applied, in part, to the synthesizer 314 as synthesizer program instructions. A portion of the synthesizer program instructions includes a count control.

Figure 4:
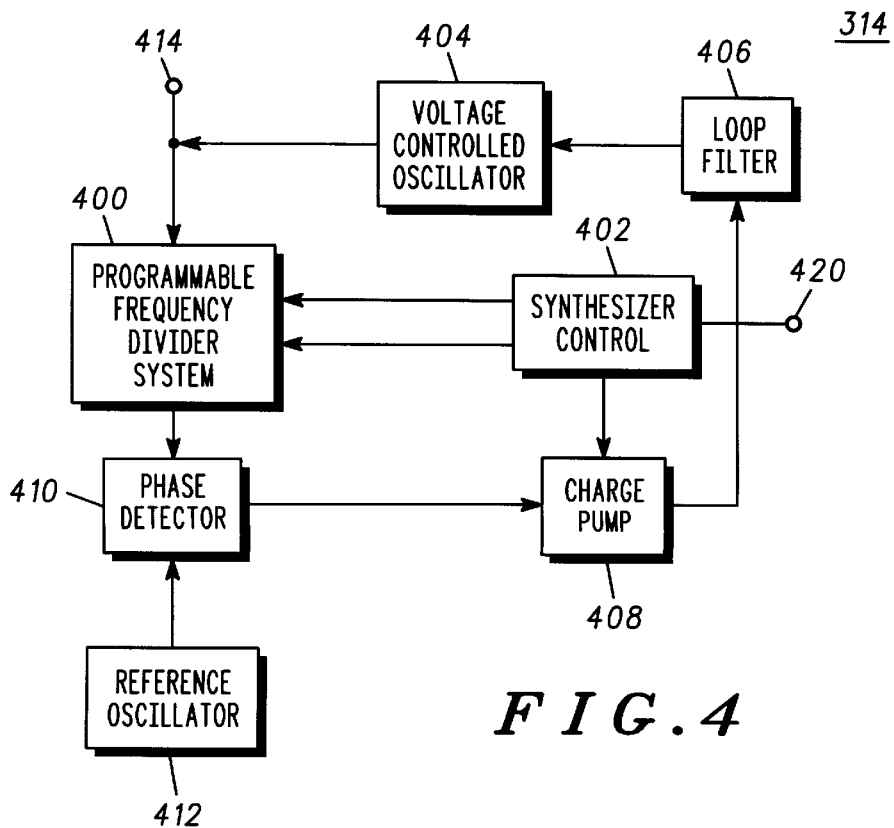
FIG. 4 is a block diagram of a frequency synthesizer which may employ a single counter dual modulus frequency divider apparatus.

A basic block diagram of the synthesizer 314 employing the single counter dual modulus frequency divider apparatus 400 is shown in FIG. 4. Program instructions from the control logic 312 for the synthesizer 314 are entered at the synthesizer control port 420. The RF signal generated by the VCO 404 is coupled to the single counter dual modulus frequency divider apparatus 400 as an input signal and divided by a total divide ratio, $N_T$. The resultant output divided signal is applied to a phase detector 410, which compares the output divided signal to a reference signal from the reference oscillator 412. The output of the phase detector 410 is converted to a charge by the charge pump 408 and coupled through a loop filter 406 to create a correction signal for the VCO 404.

Figure 5:
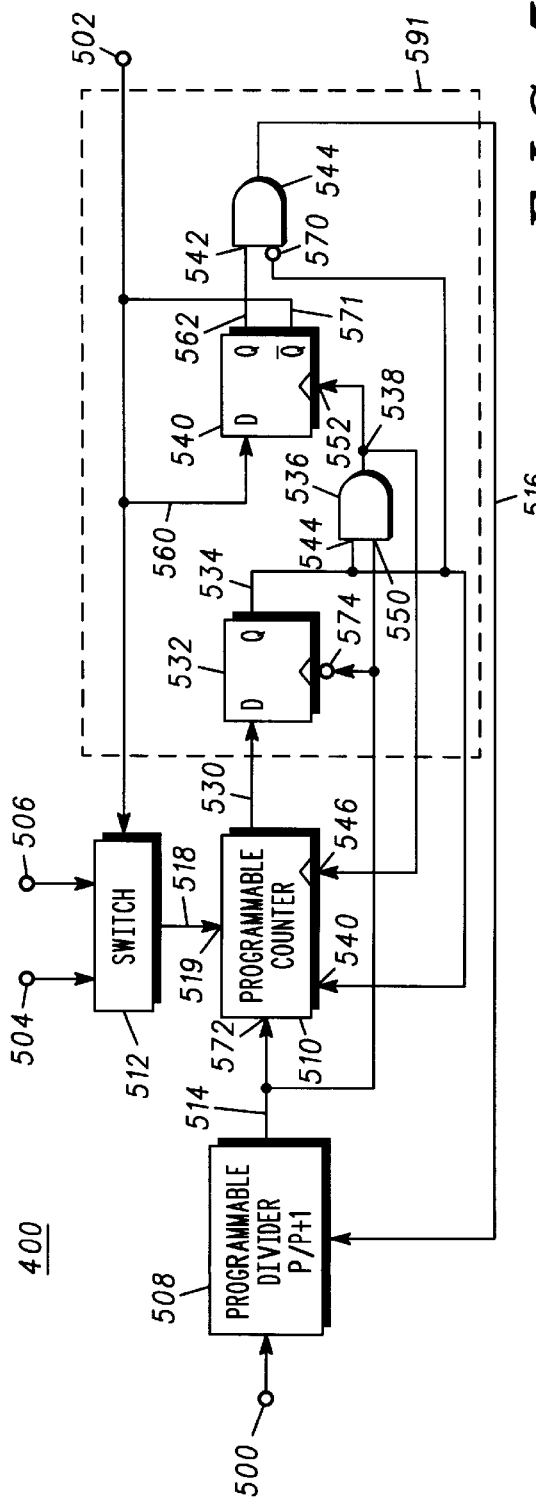
FIG. 5 is a block diagram of a single counter dual modulus frequency divider apparatus in accordance with the present invention.

The single counter dual modulus frequency divider apparatus 400 is shown in FIG. 5 and generally comprises a programmable divider 508, a programmable counter 510, a count value production means, here shown as switch 512, and a re-timer and clock generation circuit 591. The RF input signal generated by the VCO 404 is applied to the programmable divider 508 through the divider system input 500. The switch 512 is configured to receive a first program instruction at a first program instruction input 504 and a second program instruction at a second program instruction input 506 to produce a count control 518 in response to the output divided signal appearing at the divider system output 502. In an alternate embodiment, the switch 512 comprises a multiplexer.

The count control 518 is applied to a second input 519 of a programmable counter 510 to set the count value of the programmable counter 510. The counted signal output of the programmable counter 510 is coupled by line 530 to latch 532. The output of latch 532 is coupled by line 534 to a first input 544 of a first AND gate 536, a third input 540 of the programmable counter 510, and inverting first input 570 of second AND gate 544. The divided signal produced at the programmable divider output 514 is applied to a first input 572 of the programmable counter 510, second input 550 of first AND gate 536, and an inverting clock input 574 of latch 532.

The output of first AND gate 536 is coupled to a fourth input 546 of the programmable counter 510 and clock input 552 of toggle flip-flop 540. An output 562 of the toggle flip-flop 540 is coupled to second input 542 of second AND gate 544. An inverted output 571 of the toggle flip-flop 540 is coupled to switch 512, input 560 of the toggle flip-flop 540, and the divider system output 502. The final output divided signal is produced at the divider system output 502. The second AND gate 544 produces a modulus control 516 that is applied to the programmable divider 508 to select the programmable divide value of the programmable divider 508.

In order to achieve the desired overall divide ratio, $N_T$, the programmable counter 510 is programmed to two different count values by the count control 518 during a single period of the output divided signal appearing at the divider system output 502. Only one counter is utilized to perform the second frequency division function of the distributed frequency division process.

In the illustrated embodiment, a switch 512 is utilized to receive a first program instruction and a second program instruction to program the programmable counter 510 to a first count value, U, and a second count value, L, respectively, in response to the output divided signal appearing at the divider system output 502. Also in the illustrated embodiment, a number of periods of the divided signal appearing at the programmable divider output 514 may be needed to set the programmable counter 510 to the U and L count settings. The number of periods of the divided signal appearing at the programmable divider output 514 necessary to program the U and L program instructions can be defined by the variables $X_1$ and $X_2$. The overall divide ratio, $N_T$, is then defined by:

$$N_T=(P+1)(U+X_1)+P(L+X_2)$$

In alternate embodiments, it may be suitable to use no additional periods of the divided signal appearing at the programmable divider output 514 in order to program the programmable counter 510, in which case $X_1=X_2=0$.

Looking to FIG. 5 in more detail, a new programming cycle begins when the programmable counter 510 has fully decremented its second count value and one complete period of the output divided signal is produced at output 502. The latch 532 synchronizes the counted signal output appearing on line 530 to the divided signal produced at the programmable divider output 514 and produces a synchronized load signal on line 534 by holding the output of the programmable counter 510 constant for one half clock cycle of the divided signal. This latching of the output of the programmable counter is used for the load cycle and eliminates a race condition. If the output of the programmable counter was not latched, a race condition would occur wherein the programmable counter would not finish loading a new count value, and invalid programming would occur.

The synchronized load signal appearing on line 534 is applied to the third input 540 for use as a load signal for the programmable counter 510. In addition, the output of the latch 532 appearing on line 534 is used by the first AND gate 536 in conjunction with the divided signal appearing on line 514 to generate a load clock signal on line 538. The load clock signal is applied to the third input 546 of the programmable counter for loading of the count control 518. In addition, the load clock signal is used by the toggle flip-flop 540 to generate the output divided signal at inverted output 571, which is used to select the count value. The output 562 of toggle flip-flop 540 is used by the second AND gate 544 for generation of the modulus control signal appearing on line 516.

The re-timer and clock generation circuit 591 allows the programmable counter 510 of the single counter dual modulus frequency divider apparatus 400 to have either of the count values to be zero or a low number, such as 1. This is accomplished because the critical path of detecting the final count value on line 530 to the loading of the new program value is spread across additional clock cycles. The intermediate, additional clock cycles are used to detect lower count values.

Figure 6:
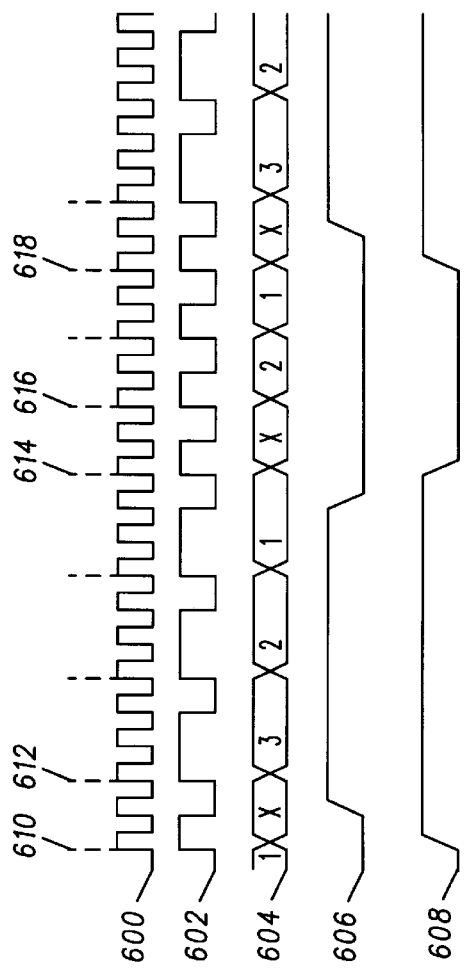
FIG. 6 illustrates possible waveforms for a single counter dual modulus frequency divider apparatus.

FIG. 6 is an example of the waveforms that would result when the overall divide ratio, $N_T$, is set to 17, the programmable counter 510 is set to a first count value of U=3 and a second count value of L=2, the programmable divider 508 is set to P=2, $X_1=0$, and $X_2=2$. At time 610, the programmable divider 508 divides the RF input signal 600 by a factor of P=2, and one period of the divided signal 602 is used to re-program the programmable counter 510 to the U=3 count value, whereby the modulus control signal 606 re-programs the programmable divider 508 to a divide factor of P+1=3. Also at time 610, the output divided signal 608 begins to appear, with a first polarity, at the divider system output 502. At time 612, the programmable divider 508 begins to divide the RF input signal 600 by a factor of P+1=3, and the programmable counter 510 starts to count a first number of periods (U=3) of the divided signal 602.

The programmable counter waveform 604 represents the decrementing value of the programmable counter 510. After the programmable counter 510 has counted U=3 periods of the divided signal 602 at time 614, the modulus control signal 606 sets the programmable divider 508 to a divide value of P=2, and one period of the divided signal 602 is used in order for the programmable counter 510 to be set to the second count value of L=2. Also at time 614, the polarity of the output divided signal 608 is inverted to a second polarity. In alternate embodiments, the polarity of the output divided signal may be inverted at a time earlier or later than time 614. At time 616, the programmable counter 510 starts to count a second number of periods (L=2) of the divided signal 602. When the programmable counter 510 has fully decremented at time 618, one complete period of the output divided signal 608 is produced. Also at time 618, the programming cycle begins again, with the user having the option of programming the same overall divide value or a different overall divide value.

A single counter dual modulus frequency divider apparatus in accordance with the present invention has several advantages over previous dual modulus frequency divider systems. Since there is only one programmable counter in the single counter dual modulus frequency divider apparatus, there is a space and power consumption savings. In addition, the single counter dual modulus frequency divider apparatus unlocks the dependency of the first count value being less than the second count value, which adds program flexibility to the system. This program flexibility also allows for an output divided signal with a duty cycle close to 50%. The output divided signal having a duty cycle close to 50% will result in additional power consumption savings in the circuitry that must further process the output divided signal. The single counter dual modulus frequency divider apparatus has the capability for the A and B count value to be programmed to zero. Also, the critical timing path in previous single counter dual modulus frequency divider systems has been circumvented to both increase frequency performance and reduce power dissipation. The dual modulus programmable frequency divider system does not contain a comparator circuit and the associated additional logic circuitry needed for the comparator interface resulting in further power consumption and area savings.

The previous description of the preferred embodiments are provided to enable any person skilled in the art to make or use the single counter dual modulus frequency divider apparatus. Various modifications to these embodiments will be readily apparent to those skilled in the art, and the generic principles defined herein may be applied to other embodiments without the use of the inventive faculty.

What is claimed is:

1. A single counter dual modulus frequency divider apparatus comprising:

a programmable divider configured to receive an input signal and a modulus control, the modulus control to set a programmable divide value of the programmable divider, the programmable divider to divide the input signal by the programmable divide value to produce a divided signal;

a programmable counter configured to receive the divided signal at a first input and a count control at a second input, the count control to set a count value of the programmable counter, the programmable counter to count periods of the divided signal and produce a counted signal; and a re-timer and clock generation circuit coupled to the programmable divider and the programmable counter to process the counted signal and produce the modulus control and an output divided signal, the re-timer and clock generation circuit including:

a latch to process the counted signal and produce a synchronized load signal for application to a third input of the programmable counter, a first AND gate for receiving the synchronized load signal and the divided signal and producing a load clock signal for application to a fourth input of the programmable counter, a toggle flip-flop to receive the load clock signal and produce the output divided signal, and a second AND gate to receive an inverted output divided signal and the synchronized load signal to produce the modulus control.

2. The single counter dual modulus frequency divider apparatus as in claim 1 further comprising a switch configured to receive program instructions, the switch to produce the count control for the programmable counter in response to the output divided signal.

3. The single counter dual modulus frequency divider apparatus as in claim 2 wherein the switch comprises a multiplexer.

4. The single counter dual modulus frequency divider apparatus as in claim 3 wherein the multiplexer has a first input for receiving a first program instruction and a second input for receiving a second program instruction and a third input configured to receive the output divided signal.

5. A radiotelephone comprising:

a receiver for receiving data, the data including automatic frequency control information;

a transmitter for transmitting information;

control logic for controlling the radiotelephone and providing synthesizer program instructions, the synthesizer program instructions including a count control;

a synthesizer responsive to the automatic frequency control information and the synthesizer program instructions and to generate RF signals for use by the receiver and the transmitter, the synthesizer including:

a programmable divider configured to receive an input signal and a modulus control, the modulus control to set a programmable divide value of the programmable divider, the programmable divider to divide the input signal by the programmable divide value to produce a divided signal;

a programmable counter configured to receive the divided signal at a first input and a count control at a second input, the count control to set a count value of the programmable counter, the programmable counter to count periods of the divided signal and produce a counted signal; and a re-timer and clock generation circuit coupled to the programmable divider and the programmable counter to process the counted signal and produce the modulus control and an output divided signal, the re-timer and clock generation circuit including:

a latch to process the counted signal and produce a synchronized load signal for application to a third input of the programmable counter, a first AND gate for receiving the synchronized load signal and the divided signal and producing a load clock signal for application to a fourth input of the programmable counter, a toggle flip-flop to receive the load clock signal and produce the output divided signal, and a second AND gate to receive an inverted output divided signal and the synchronized load signal to produce the modulus control.

6. The radiotelephone as in claim 5 further comprising a switch configured to receive a portion of the synthesizer program instructions, the switch to produce the count control for the programmable counter in response to the output divided signal.

7. The radiotelephone as in claim 6 wherein the switch comprises a multiplexer.

8. The radiotelephone as in claim 7 wherein the multiplexer has a first input for receiving a first program instruction and a second input for receiving a second program instruction and a third input configured to receive the output divided signal.

* * * * *